(12) United States Patent
Park et al.

(10) Patent No.: US 9,660,165 B2
(45) Date of Patent: *May 23, 2017

(54) THERMOELECTRIC CONVERSION MATERIAL AND PRODUCING METHOD THEREOF, AND THERMOELECTRIC CONVERSION ELEMENT USING THE SAME

(71) Applicant: LG CHEM, LTD., Seoul (KR)

(72) Inventors: Cheol-Hee Park, Daejeon (KR); Se-Hui Sohn, Daejeon (KR); Seung-Tae Hong, Daejeong (KR); Won-Jong Kwon, Daejeon (KR); Tae-Hoon Kim, Seoul (KR)

(73) Assignee: LG CHEM, LTD., Seoul (KR)

( * ) Notice: Subject to any disclaimer, the term of this patent is extended or adjusted under 35 U.S.C. 154(b) by 164 days.

This patent is subject to a terminal disclaimer.

(21) Appl. No.: 14/470,564

(22) Filed: Aug. 27, 2014

(65) Prior Publication Data

US 2015/0053899 A1    Feb. 26, 2015

Related U.S. Application Data

(60) Continuation-in-part of application No. 14/175,513, filed on Feb. 7, 2014, which is a division of
(Continued)

(30) Foreign Application Priority Data

Aug. 29, 2008  (KR) ........................ 10-2008-0085240
Oct. 6, 2008   (KR) ........................ 10-2008-0097779
Nov. 11, 2008  (KR) ........................ 10-2008-0111557

(51) Int. Cl.
*H01B 1/08* (2006.01)
*H01L 35/16* (2006.01)
(Continued)

(52) U.S. Cl.
CPC ............... *H01L 35/18* (2013.01); *H01B 1/08* (2013.01); *H01L 31/0272* (2013.01);
(Continued)

(58) Field of Classification Search
CPC .. H01B 1/00; H01B 1/08; H01L 35/16; H01L 35/22
See application file for complete search history.

(56) References Cited

U.S. PATENT DOCUMENTS 4,366,336 A   12/1982 Donaghey
5,418,007 A   5/1995 Debe
(Continued)

FOREIGN PATENT DOCUMENTS

CN    1478308 A    2/2004
JP    11-031849    2/1999
(Continued)

OTHER PUBLICATIONS

B.A. Popovkin et al., "New Layered Phases of the MOCuX (M=Ln, Bi; X=S, Se, Te) Family: A Geometric Approach to the Explanation of Phase Stability", Russian Journal of Inorganic Chemistry, vol. 43, No. 10, 1998, pp. 1471-1475.
(Continued)

*Primary Examiner* — Mark Kopec
(74) *Attorney, Agent, or Firm* — Dentons US LLP

(57) ABSTRACT

Thermoelectric conversion materials, expressed by the following formula: $Bi_{1-x}M_xCu_{1-w}O_{a-y}Q1_yTe_{b-z}Q2_z$. Here, M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb; x, y, z, w, a, and b are $0 \leq x < 1$, $0 < w < 1$, $0.2 < a < 4$, $0 \leq y < 4$, $0.2 < b < 4$, $0 \leq z < 4$ and $x+y+z > 0$. These thermoelectric conversion materials may be used for thermoelectric conversion elements, where they
(Continued)

may replace thermoelectric conversion materials in common use, or be used along with thermoelectric conversion materials in common use.

14 Claims, 13 Drawing Sheets

Related U.S. Application Data application No. 13/531,186, filed on Jun. 22, 2012, now Pat. No. 8,715,538, which is a continuation of application No. 12/906,917, filed on Oct. 18, 2010, now Pat. No. 8,226,843, which is a continuation of application No. PCT/KR2008/007041, filed on Nov. 28, 2008.

(51) Int. Cl.
  *H01L 35/18* (2006.01)
  *H01L 35/22* (2006.01)
  *H01L 31/0272* (2006.01)
  *H01L 31/032* (2006.01)
  *H01L 31/072* (2012.01)
  *H01L 31/0725* (2012.01)

(52) U.S. Cl.
  CPC .......... *H01L 31/032* (2013.01); *H01L 31/072* (2013.01); *H01L 31/0725* (2013.01); *H01L 35/16* (2013.01); *H01L 35/22* (2013.01); *Y02E 10/50* (2013.01)

(56) References Cited

U.S. PATENT DOCUMENTS

| | | | |
|---|---|---|---|
| 5,431,021 A | 7/1995 | Gwilliam et al. | |
| 5,487,952 A | 1/1996 | Yoo et al. | |
| 5,726,381 A * | 3/1998 | Horio | H01L 35/16 136/201 |
| 6,091,014 A | 7/2000 | Eklund et al. | |
| 6,251,701 B1 | 6/2001 | McCandless | |
| 6,384,312 B1 | 5/2002 | Ghoshal et al. | |
| 6,444,894 B1 | 9/2002 | Sterzel | |
| 6,660,925 B1 | 12/2003 | Sharp | |
| 6,942,728 B2 | 9/2005 | Caillat et al. | |
| 7,091,136 B2 | 8/2006 | Basol | |
| 7,649,139 B2 | 1/2010 | Mihara et al. | |
| 2003/0110892 A1 | 6/2003 | Nicoloau | |
| 2005/0139249 A1 | 6/2005 | Ueki et al. | |
| 2011/0017935 A1 | 1/2011 | Park et al. | |

FOREIGN PATENT DOCUMENTS

| | | |
|---|---|---|
| JP | 11-186616 | 7/1999 |
| JP | 2001-223392 | 8/2001 |
| JP | 2002-232026 | 8/2002 |
| JP | 2004-288841 | 10/2004 |
| JP | 2007-258200 | 10/2007 |
| JP | 2008-085309 | 4/2008 |

OTHER PUBLICATIONS

Kouichi Takase et al., "Charge Density Distribution of Transparent p-type Semiconductor (LaO) CuS", Applied Physics Letters 90, (2007) pp. 161916 (1-3).

Evans et al. "Synthesis and characterization of the new oxyselenide B12YO4Cu2Se2", Chem. Commun., 2002, pp. 912-913.

Ohtani et al. "Electrical Properties of layered copper oxyselenides (BiO)Cu1—$x$Se and (Bi1—$x$Sr$x$)OCuSe", Journal of Alloys and Compounds 262-263 (1997) 175-179.

Hiramatsu et al., "Crystal Structures, Optoelectronic Properties, and Electronic Structures of Layered Oxychalcogenides MCuOCh (M=Bi, La; Ch=S, Se, Te); Effects of Electronic Configurations of M3+Ions", Chem. Mater. 2008, 20, 326-334.

Stampler et al., "Temperature Driven Reactant Solubilization Synthesis of BiCuOSe", Inorg. Chem. 2008, 47, 10009-16.

Zhao et al., "Bi1—$x$Sr$x$CuSeO oxyselenides as promising thermoelectric materials", Applied Physics Letters 97, 092118 (2010).

Sheets et al., "Facile Synthesis of BiCuOS by Hydrothermal Synthesis", Inorganic Chem. 2007, 46, 10741-48.

* cited by examiner

THERMOELECTRIC CONVERSION MATERIAL AND PRODUCING METHOD THEREOF, AND THERMOELECTRIC CONVERSION ELEMENT USING THE SAME

CROSS REFERENCE TO RELATED APPLICATIONS

This application is a continuation-in-part of U.S. Ser. No. 14/175,513, filed on Feb. 7, 2014, which is a divisional of U.S. Ser. No. 13/531,186, filed on Jun. 22, 2012, now issued as U.S. Pat. No. 8,715,538, which is a continuation of U.S. Ser. No. 12/906,917, filed on Oct. 18, 2010, now issued as U.S. Pat. No. 8,226,843, which is a continuation of International Application No. PCT/KR2008/007041 filed Nov. 28, 2008, which claims priorities to Korean Patent Applications Nos. 10-2008-0085240, 10-2008-0097779 and 10-2008-0111557 filed in Republic of Korea on Aug. 29, 2008, Oct. 6, 2008 and Nov. 11, 2008, respectively, the entire contents of which are incorporated herein by reference.

TECHNICAL FIELD

The present invention provides new thermoelectric conversion material, their method of preparation, and thermoelectric conversion elements by using the same.

BACKGROUND OF THE INVENTION

The thermoelectric conversion element is applied to thermoelectric conversion power generation or thermoelectric conversion cooling. For example, for the thermoelectric conversion power generation, a temperature difference is applied to the thermoelectric conversion element to generate thermoelectromotive force, and then the thermoelectromotive force is used to convert thermal energy into electric energy.

Energy conversion efficiency of the thermoelectric conversion element depends on ZT value that is a performance index of thermoelectric conversion material. ZT value is determined by Seebeck coefficient, electric conductivity and thermal conductivity. In more detail, ZT value is in proportion to electric conductivity and square of Seebeck coefficient and in reverse proportion to thermal conductivity. Thus, in order to enhance the energy conversion efficiency of a thermoelectric conversion element, it is required to develop thermoelectric conversion materials with high Seebeck coefficient, high electric conductivity or low thermal conductivity.

DISCLOSURE

Technical Problem

An object of the present invention is to provide new thermoelectric conversion material having excellent thermoelectric conversion performance.

Another object of the present invention is to provide a method for producing the above new thermoelectric conversion material.

Furthermore, another object of the present invention is to provide a thermoelectric conversion element using the new thermoelectric conversion material.

Technical Solution

As a result of the research for thermoelectric conversion material, compositions of the formula 1 are proposed in the present invention. It was found that these new compounds may be used as thermoelectric conversion materials of thermoelectric conversion elements, and so on.

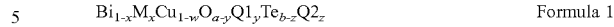

$$Bi_{1-x}M_xCu_{1-w}O_{a-y}Q1_yTe_{b-z}Q2_z \quad \text{Formula 1}$$

where M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb with $0 \le x < 1$, $0 < w < 1$, $0.2 < a < 4$, $0 \le y < 4$, $0.2 < b < 4$, $0 \le z < 4$ and $x+y+z>0$.

According to the present invention, a, y, b and z are preferably $a=1$, $0 \le y < 1$, $b=1$ and $0 \le z < 1$, respectively.

In other case, x, w, a, y, b and z are preferably $0 \le x < 0.15$, $0 < w \le 0.2$, $a=1$, $0 \le y < 0.2$, $b=1$ and $0 < z < 0.5$, respectively. Here, M is preferably any one selected from the group consisting of Sr, Cd, Pb and Tl, and Q1 and Q2 are preferably Se or Sb, respectively.

In another aspect of the present invention, it provides methods for producing thermoelectric conversion materials expressed by the formula 1 by heating mixtures of $Bi_2O_3$, Bi, Cu, Te, and at least one selected from the group consisting of elemental Ba, Sr, Ca, Mg, Cs, K, Na, Cd, Hg, Sn, Pb, Mn, Ga, In, Tl, As and Sb, or their oxides.

Alternatively, the present invention provides methods for producing thermoelectric conversion materials expressed by the formula 1 by heating mixtures of $Bi_2O_3$, Bi, Cu, Te, at least one selected from the group consisting of elemental S, Se, As, and Sb, or their oxides, and optionally at least one selected from the group consisting of elemental Ba, Sr, Ca, Mg, Cs, K, Na, Cd, Hg, Sn, Pb, Mn, Ga, In, Tl, As, and Sb, or their oxides.

In the method according to the present invention, the sintering process is preferably executed at temperatures of 400 to 570° C.

Advantageous Effects

The new thermoelectric conversion materials of the present invention may replace thermoelectric conversion materials in common use, or be used along with thermoelectric conversion materials in common use. In particular, the thermoelectric conversion materials may be useful for thermoelectric conversion elements due to their excellent thermoelectric conversion performance.

DESCRIPTION OF DRAWINGS

Other objects and aspects of the present invention will become apparent from the following description of embodiments with reference to the accompanying drawing in which.

BEST MODE

Figure 1:
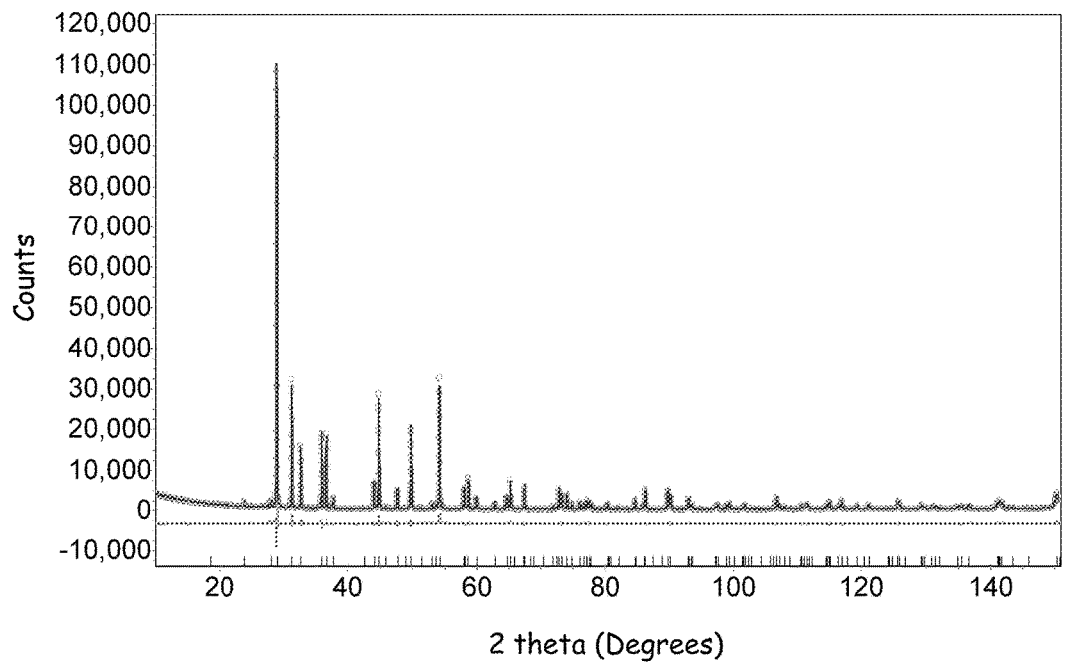
FIG. 1 shows Rietveld refinement profiles for BiCuOTe, comparing X-ray diffraction pattern with a calculated pattern from a structural model.

Compositions of the thermoelectric conversion materials of the present invention are expressed by the following formula 1.

$$Bi_{1-x}M_xCu_{1-w}O_{a-y}Q1_yTe_{b-z}Q2_z \quad \text{Formula 1}$$

In the formula 1, M is at least one element selected from the group consisting of Ba, Sr, Ca, Mg, Cs, K, Na, Cd, Hg, Sn, Pb, Mn, Ga, In, Tl, As and Sb, and Q1 and Q2 are at least one element selected from the group consisting of S, Se, As and Sb with 0≤x<1, 0<w<1, 0.2<a<4, 0≤y<4, 0.2<b<4, 0≤z<4 and x+y+z>0.

In the formula 1, x, y, and z are preferably 0≤x≤½, 0≤y≤a/2 and 0≤z≤b/2, respectively.

In the formula 1, a, y, b and z of the formula 1 are preferably a=1, 0≤y<1, b=1 and 0≤z<1, respectively. In other cases, x, w, a, y, b and z may be respectively 0≤x<0.15, 0<w≤0.2, a=1, 0≤y<0.2, b=1 and 0≤z<0.5. Here, M is preferably any one selected from the group consisting of Sr, Cd, Pb and Tl, and Q1 and Q2 are preferably Se or Sb, respectively.

For the thermoelectric conversion materials of the formula 1, it is more preferred that x, a, y, b and z of the formula 1 are respectively 0<x<0.15, a=1, y=0, b=1 and z=0, and M is any one selected from the group consisting of Sr, Cd, Pb and Tl. In addition, in the formula 1 where x, a, y, b and z of the formula 1 are respectively x=0, a=1, y=0, b=1 and 0<z≤0.5, and Q2 is Se or Sb.

Meanwhile, the thermoelectric conversion materials expressed by the formula 1 may be produced by mixing powders of Bi$_2$O$_3$, Bi, Cu and Te and then vacuum-sintering the mixture, but the present invention is not limited thereto.

Also, the thermoelectric conversion materials expressed by the formula 1 may be produced by heating mixtures of Bi$_2$O$_3$, Bi, Cu, Te, and at least one selected from the group consisting of Ba, Sr, Ca, Mg, Cs, K, Na, Cd, Hg, Sn, Pb, Mn, Ga, In, Tl, As and Sb, or their oxides in an evacuated silica tube, however the present invention is not limited thereto.

In addition, the thermoelectric conversion materials expressed by the formula 1 may be produced by heating mixtures of Bi$_2$O$_3$, Bi, Cu, Te, at least one element selected from the group consisting of S, Se, As and Sb, or their oxides, and optionally at least one selected from the group consisting of Ba, Sr, Ca, Mg, Cs, K, Na, Cd, Hg, Sn, Pb, Mn, Ga, In, Tl, As, and Sb, or their oxides in an evacuated silica tube, however the present invention is not limited thereto.

The thermoelectric conversion materials of the present invention may be produced by sintering mixtures in a flowing gas such as Ar, He or N$_2$, which partially includes hydrogen or does not include hydrogen. The sintering process is preferably executed at a temperature of 400 to 750° C., more preferably 400 to 570° C.

MODE FOR INVENTION

Hereinafter, the preferred embodiment of the present invention will be described in detail based on examples. However, the embodiments of the present invention may be modified in various ways, and the scope of the present invention should not be interpreted as being limited to the examples. The embodiments of the present invention are provided just for explaining the present invention more perfectly to those having ordinary skill in the art.

Example 1

BiCuOTe

In order to prepare BiCuOTe, 1.1198 g of Bi$_2$O$_3$ (Aldrich, 99.9%, 100 mesh), 0.5022 g of Bi (Aldrich, 99.99%, <10 μm), 0.4581 g of Cu (Aldrich, 99.7%, 3 μm), and 0.9199 g of Te (Aldrich, 99.99%, ~100 mesh) were well mixed by using agate mortar, and then heated in an evacuated silica tube at 510° C. for 15 hours, thereby obtaining BiCuOTe powder.

The powder X-ray diffraction (XRD) data were collected at room temperature on a Bragg-Brentano diffractometer (Bruker Advance D8 XRD) with a Cu X-ray tube (λ=1.5406 Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 1 and FIG. 2.

TABLE 1

| Atom | site | x | y | z | Occup. | Beq |
|---|---|---|---|---|---|---|
| Bi | 2c | 0.25 | 0.25 | 0.37257(5) | 1 | 0.56(1) |
| Cu | 2a | 0.75 | 0.25 | 0 | 1 | 0.98(3) |
| O | 2b | 0.75 | 0.25 | 0.5 | 1 | 0.26(12) |
| Te | 2c | 0.25 | 0.25 | 0.81945(7) | 1 | 0.35(1) |

Crystallographic data obtained from Rietveld refinement of BiCuOTe [Space group I4/nmm (No. 129), a=4.04138(6) Å, c=9.5257(2) Å]

FIG. 1 shows a Rietveld refinement profile that compares observed X-ray diffraction pattern of BiCuOTe with a calculated X-ray diffraction pattern from a structural model. FIG. 1 shows that the measured pattern well agrees with the calculated pattern according to Table 1, which implies that the material obtained in this example is BiCuOTe.

Figure 2:
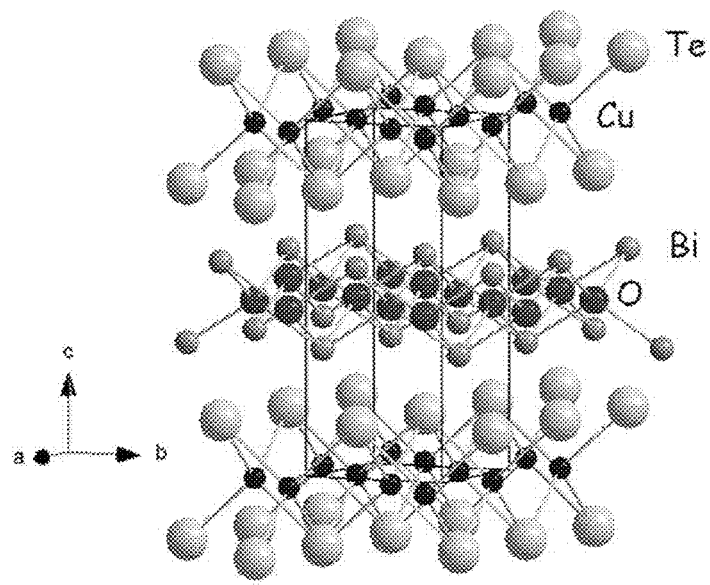
FIG. 2 shows the crystal structure of BiCuOTe.

As shown in FIG. 2, the BiCuOTe exhibits a natural super-lattice structure in which $Cu_2Te_2$ layers and $Bi_2O_2$ layers are repeated along a c-crystalline axis. Also, it can be said that BiTeCu layers and O layers are repeated along the c-crystalline axis in the natural super-lattice structure.

Example 2

$BiCu_{0.9}OTe$

In order to prepare $BiCu_{0.9}OTe$, 1.1371 g of $Bi_2O_3$ (Aldrich, 99.9%, 100 mesh), 0.51 g of Bi (Aldrich, 99.99%, <10 μm), 0.4187 g of Cu (Aldrich, 99.7%, 3 μm), and 0.9342 g of Te (Aldrich, 99.99%, ~100 mesh) were well mixed by using agate mortar, and then heated in an evacuated silica tube at 510° C. for 15 hours, thereby obtaining $BiCu_{0.9}TeO$ powder.

Figure 3:
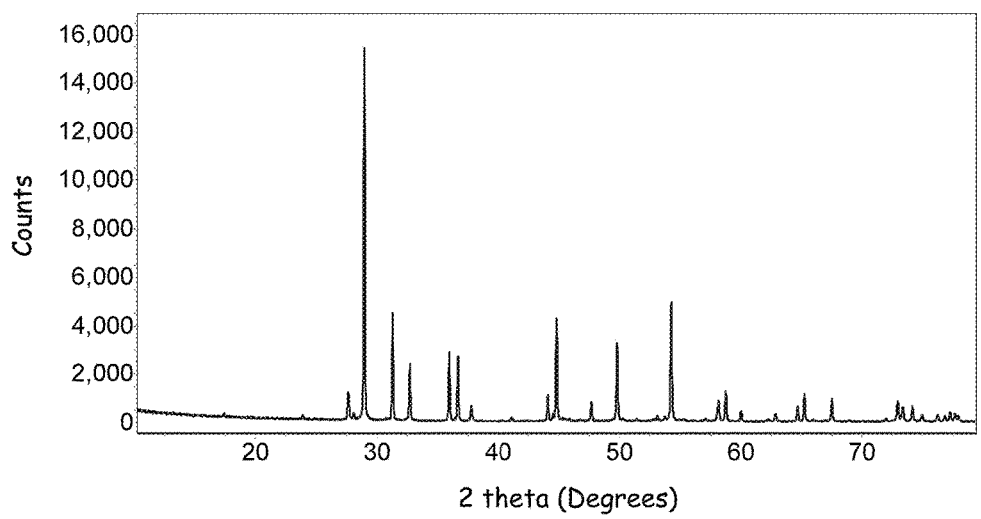
FIG. 3 shows X-ray diffraction pattern of $BiCu_{0.9}OTe$.

X-ray diffraction analysis was conducted for the sample in the same way as the example 1. As shown in FIG. 3, the material obtained in the example 2 was identified as $BiCu_{0.9}TeO$.

Example 3

$Bi_{0.98}Pb_{0.02}CuOTe$

In order to prepare $Bi_{0.98}Pb_{0.02}CuOTe$, 2.5356 g of $Bi_2O_3$ (Aldrich, 99.9%, 100 mesh), 1.1724 g of Bi (Aldrich, 99.99%, <10 μm), 1.0695 g of Cu (Aldrich, 99.7%, 3 μm), 0.0751 g of PbO (Canto, 99.5%), and 2.1475 g of Te (Aldrich, 99.99%, ~100 mesh) were well mixed by using agate mortar, and then heated in an evacuated silica tube at 510° C. for 15 hours, thereby obtaining $Bi_{0.98}Pb_{0.02}CuOTe$ powder.

The powder X-ray diffraction (XRD) data were collected at room temperature on a Bragg-Brentano diffractometer (Bruker D4-Endeavor XRD) with a Cu X-ray tube ($\lambda$=1.5406 Å, 50 kV, 40 mA). The step size was 0.02 degree.

TOPAS program (R. W. Cheary, A. Coelho, J. Appl. Crystallogr. 25 (1992) 109-121; Bruker AXS, TOPAS 3, Karlsruhe, Germany (2000)) was used in order to determine the crystal structure of the obtained material. The analysis results are shown in Table 2 and FIG. 5.

TABLE 2

| Atom | site | x | y | z | Occup. | Beq. |
|---|---|---|---|---|---|---|
| Bi | 2c | 0.25 | 0.25 | 0.37225(12) | 0.98 | 0.59(4) |
| Pb | 2c | 0.25 | 0.25 | 0.37225(12) | 0.02 | 0.59(4) |
| Cu | 2a | 0.75 | 0.25 | 0 | 1 | 1.29(10) |
| O | 2b | 0.75 | 0.25 | 0.5 | 1 | 0.9(4) |
| Te | 2c | 0.25 | 0.25 | 0.81955(17) | 1 | 0.55(5) |

Crystallographic data obtained from Rietveld refinement of $Bi_{0.98}Pb_{0.02}CuOTe$ [Space group P4/nmm (No. 129), a=4.04150(4) Å, c=9.53962(13) Å]

Figure 4:
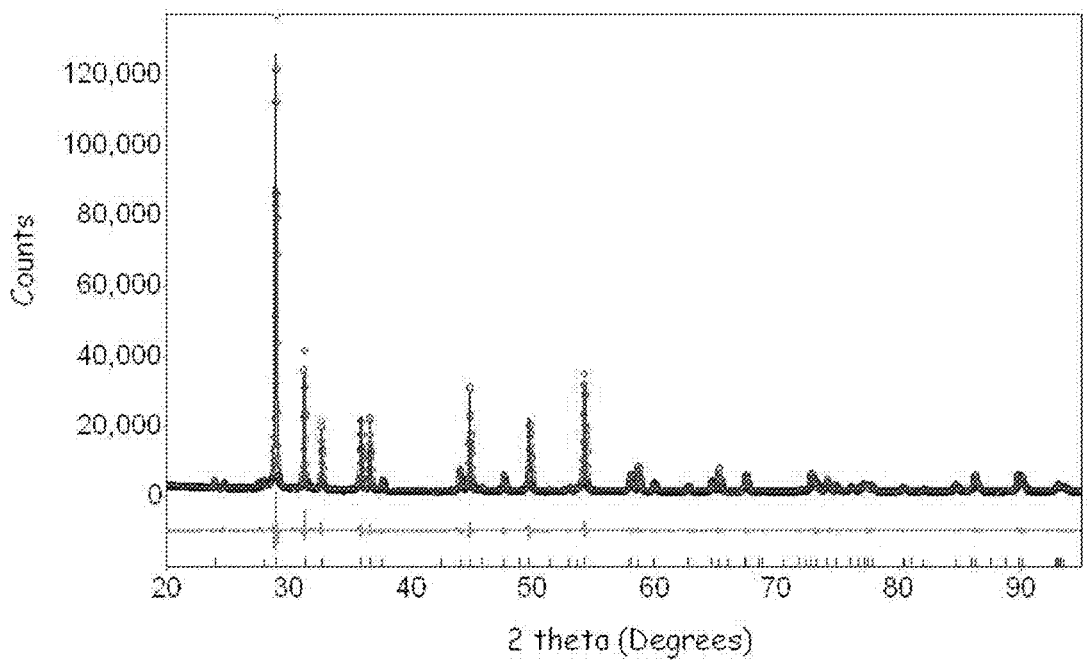
FIG. 4 shows Rietveld refinement profiles for $Bi_{0.98}Pb_{0.02}CuOTe$, comparing X-ray diffraction pattern with a calculated pattern from a structural model.

FIG. 4 shows a Rietveld refinement profile that compares observed X-ray diffraction pattern of $Bi_{0.98}Pb_{0.02}CuOTe$ with calculated pattern of a structural model. FIG. 4 shows that the measured pattern well agrees with the calculated pattern according to Table 2, which implies that the material obtained in this example is $Bi_{0.98}Pb_{0.02}CuOTe$.

Figure 5:
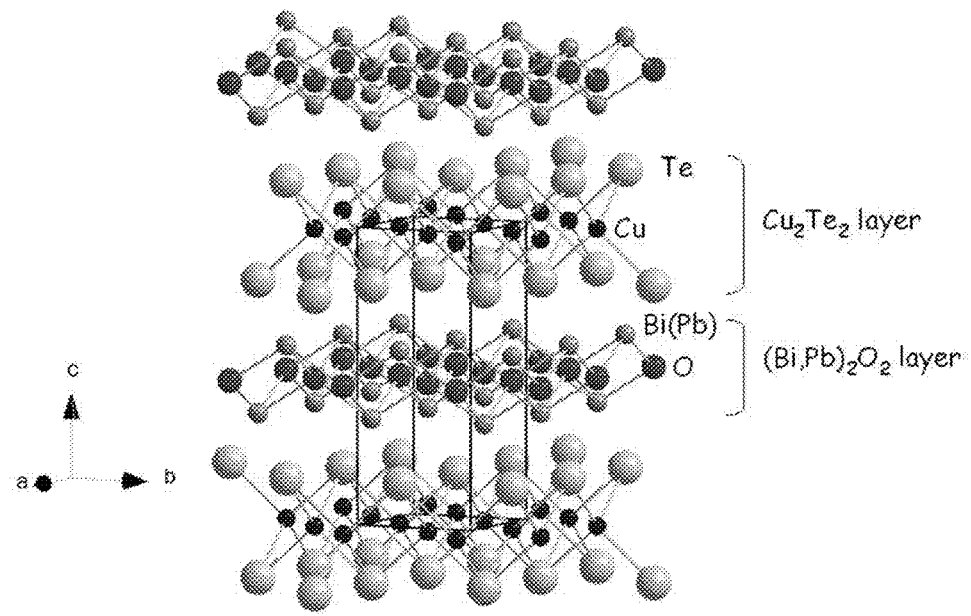
FIG. 5 shows the crystal structure of $Bi_{0.98}Pb_{0.02}CuOTe$.

As shown in FIG. 5, the $Bi_{0.98}Pb_{0.02}CuOTe$ exhibits a natural super-lattice structure in which $Cu_2Te_2$ layers and $(Bi,Pb)_2O_2$ layers where Pb is partially substituted in place of Bi are repeated along a c-crystalline axis. Also, it can be said that (Bi,Pb)TeCu layers and O layers are repeated along the c-crystalline axis in the natural super-lattice structure.

Example 4

$Bi_{0.9}Pb_{0.1}CuOTe$

In order to prepare $Bi_{0.9}Pb_{0.1}CuOTe$, 1.2721 g of $Bi_2O_3$ (Aldrich, 99.9%, 100 mesh), 0.6712 g of Bi (Aldrich, 99.99%, <10 μm), 0.6133 g of Cu (Aldrich, 99.7%, 3 μm), 0.215 g of PbO (Canto, 99.5%), and 1.2294 g of Te (Aldrich, 99.99%, ~100 mesh) were well mixed by using agate mortar, and then heated in an evacuated silica tube at 510 r for 15 hours, thereby obtaining $Bi_{0.9}Pb_{0.1}CuOTe$ powder.

Figure 6:
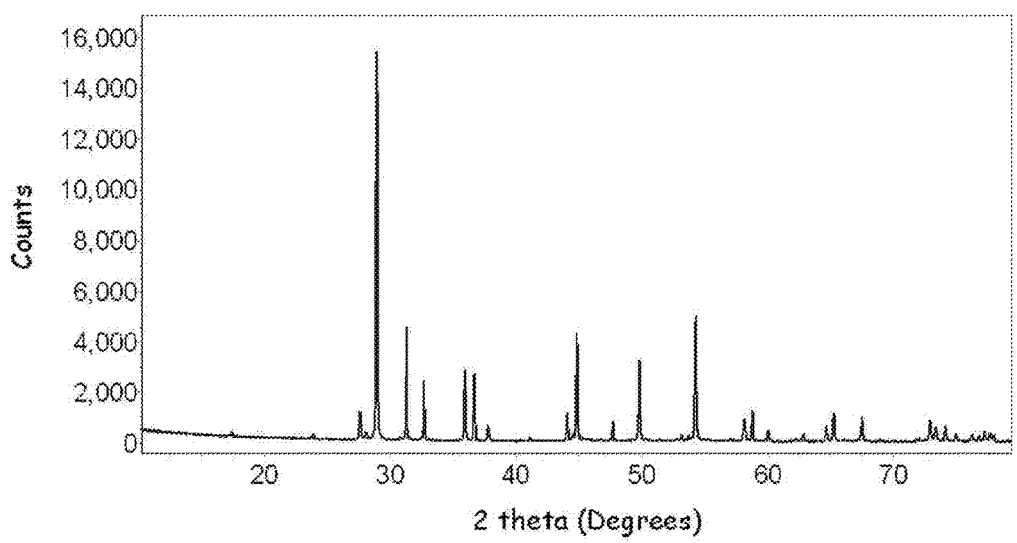
FIG. 6 shows X-ray diffraction pattern of $Bi_{0.9}Pb_{0.1}CuOTe$.

X-ray diffraction analysis was conducted for the sample in the same way as the example 3. As shown in FIG. 6, the material obtained in the example 4 was identified as $Bi_{0.9}Pb_{0.1}CuOTe$.

Example 5

$Bi_{0.9}Cd_{0.1}CuOTe$

In order to prepare $Bi_{0.9}Cd_{0.1}CuOTe$, 1.3018 g of $Bi_2O_3$ (Aldrich, 99.9%, 100 mesh), 0.6869 g of Bi (Aldrich, 99.99%, <10 μm), 0.6266 g of Cu (Aldrich, 99.7%, 3 μm), 0.1266 g of CdO (Strem, 99.999%), and 1.2582 g of Te (Aldrich, 99.99%, ~100 mesh) were well mixed by using agate mortar, and then heated in an evacuated silica tube at 510° C. for 15 hours, thereby obtaining $Bi_{0.9}Cd_{0.1}CuOTe$ powder.

Figure 7:
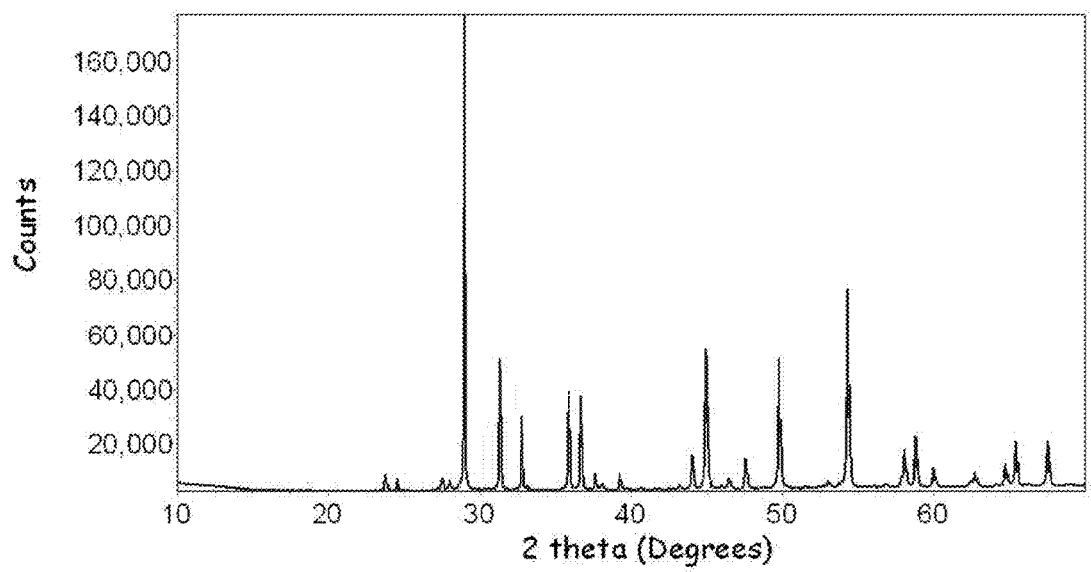
FIG. 7 shows X-ray diffraction pattern of $Bi_{0.9}Cd_{0.1}CuOTe$.

X-ray diffraction analysis was conducted for the sample in the same way as the example 3. As shown in FIG. 7, the material obtained in the example 5 was identified as $Bi_{0.9}Cd_{0.1}CuOTe$.

Example 6

$Bi_{0.9}Sr_{0.1}CuOTe$

In order to prepare $Bi_{0.9}Sr_{0.1}CuOTe$, 1.0731 g of $Bi_2O_3$ (Aldrich, 99.9%, 100 mesh), 0.5662 g of Bi (Aldrich, 99.99%, <10 μm), 0.5165 g of Cu (Aldrich, 99.7%, 3 μm), 1.0372 g of Te (Aldrich, 99.99%, ~100 mesh), and 0.0842 g of SrO were well mixed by using agate mortar. Here, SrO was obtained by thermally treating $SrCO_3$ (Alfa, 99.994%) at 1125° C. for 12 hours in the air. The material obtained by thermal treatment was confirmed as SrO by X-ray diffraction analysis.

The mixture was then heated in an evacuated silica tube at 510° C. for 15 hours, thereby obtaining $Bi_{0.9}Sr_{0.1}CuOTe$ powder.

Figure 8:
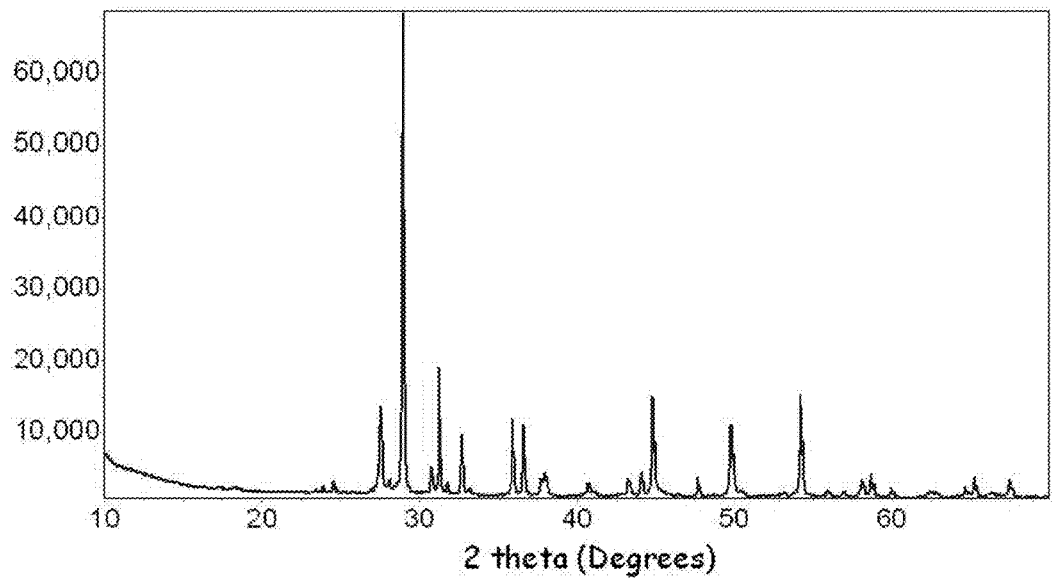
FIG. 8 shows X-ray diffraction pattern of $Bi_{0.9}Sr_{0.1}CuOTe$.

The powder X-ray diffraction (XRD) data were collected at room temperature on a Bragg-Brentano diffractometer (Bruker D8 Advance XRD) with a Cu X-ray tube ($\lambda$=1.5406 Å, 50 kV, 40 mA). The step size was 0.02 degree. FIG. 8 shows that the material obtained in the example 6 is $Bi_{0.9}Sr_{0.1}CuOTe$.

Example 7

$BiCuOSe_{0.5}Te_{0.5}$

In order to prepare $BiCuOSe_{0.5}Te_{0.5}$, 1.9822 g of $Bi_2O_3$ (Aldrich, 99.9%, 100 mesh), 0.889 g of Bi (Aldrich, 99.99%, <10 μm), 0.811 g of Cu (Aldrich, 99.7%, 3 μm), 0.5036 g of Se (Aldrich, 99.99%), and 0.8142 g of Te (Aldrich, 99.99%, ~100 mesh) were well mixed by using agate mortar, and then heated in an evacuated silica tube at 510° C. for 15 hours, thereby obtaining BiCuOSe$_{0.5}$Te$_{0.5}$ powder.

Figure 9:
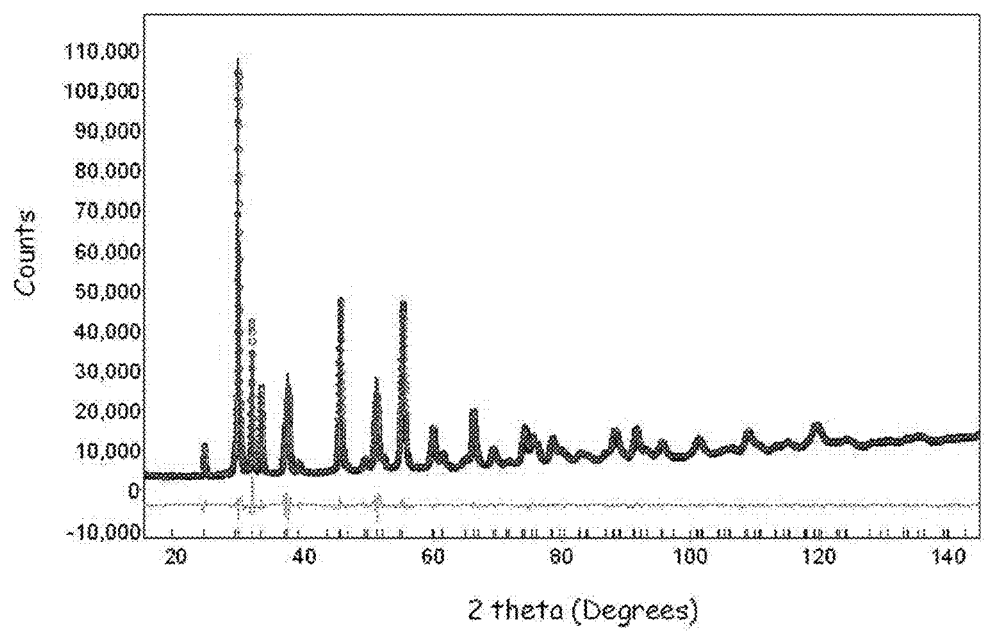
FIG. 9 shows Rietveld refinement profiles for BiCuOSe$_{0.5}$Te$_{0.5}$, comparing X-ray diffraction pattern with a calculated pattern from a structural model.

The powder X-ray diffraction (XRD) data were collected at room temperature on a Bragg-Brentano diffractometer (Bruker D4-Endeavor XRD) with a Cu X-ray tube (40 kV, 40 mA). The step size was 0.02 degree. At this time, variable 6 mm slit was used as a divergence slit. The results are shown in FIG. 9. Crystal structure analysis was executed in the same way as the example 3. The analysis results are shown in Table 3 and FIG. 10.

TABLE 3

| Atom | site | x | y | z | Occup. | Beq. |
|---|---|---|---|---|---|---|
| Bi | 2c | 0.25 | 0.25 | 0.36504(9) | 1 | 0.86(2) |
| Cu | 2a | 0.75 | 0.25 | 0 | 1 | 2.00(9) |
| O | 2b | 0.75 | 0.25 | 0.5 | 1 | 1.9(3) |
| Te | 2c | 0.25 | 0.25 | 0.82272(14) | 0.5 | 0.61(4) |
| Se | 2c | 0.25 | 0.25 | 0.82252(14) | 0.5 | 0.55(5) |

Crystallographic data obtained from Rietveld refinement of BiCuOSe$_{0.5}$Te$_{0.5}$ [Space group P4/nmm (No. 129), a=3.99045(11) Å, c=9.2357(4) Å]

FIG. 9 shows that the measured pattern well agrees with the calculated pattern from the results in Table 3, and as a result the material obtained in this example is identified as BiCuOSe$_{0.5}$Te$_{0.5}$.

Figure 10:
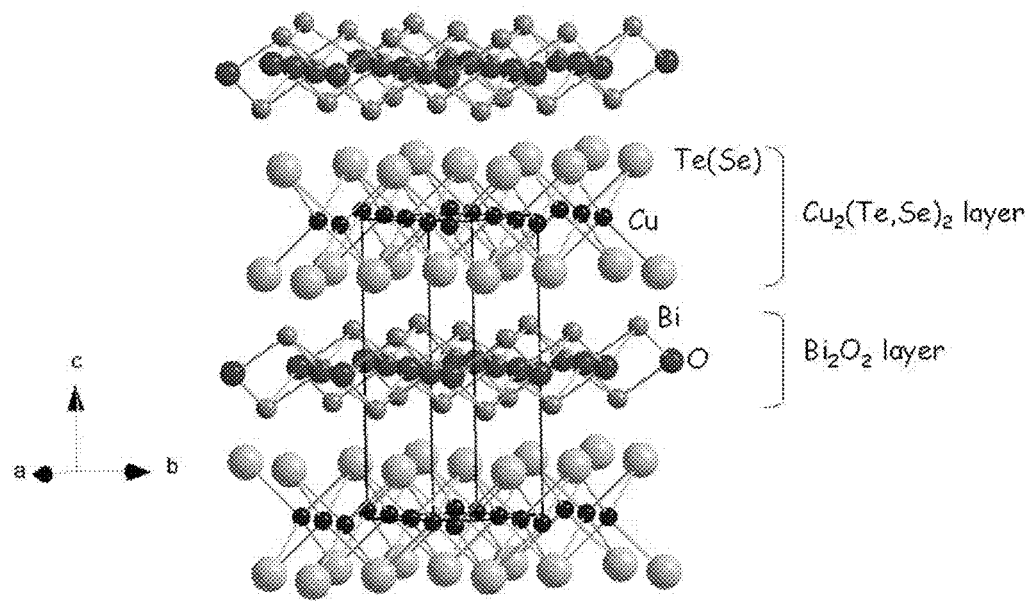
FIG. 10 shows the crystal structure of BiCuOSe$_{0.5}$Te$_{0.5}$.

As shown in FIG. 10, the BiCuOSe$_{0.5}$Te$_{0.5}$ exhibits a natural super-lattice structure in which Cu$_2$(Te,Se)$_2$ layers and Bi$_2$O$_2$ layers are repeated along a c-crystalline axis. Also, it can be said that Bi(Te,Se)Cu layers and O layers are repeated along the c-crystalline axis in the natural super-lattice structure.

Example 8

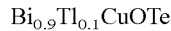
Bi$_{0.9}$Tl$_{0.1}$CuOTe

In order to prepare Bi$_{0.9}$Tl$_{0.1}$CuOTe, 1.227 g of Bi$_2$O$_3$ (Aldrich, 99.9%, 100 mesh), 0.7114 g of Bi (Aldrich, 99.99%, <10 μm), 0.6122 g of Cu (Aldrich, 99.7%, 3 μm), 1.2293 g of Te (Aldrich, 99.99%, ~100 mesh), and 0.22 g of Tl$_2$O$_3$ (Aldrich) were well mixed by using agate mortar.

The mixture was then heated in an evacuated silica tube at 510° C. for 15 hours, thereby obtaining Bi$_{0.9}$Tl$_{0.1}$CuOTe powder.

Figure 11:
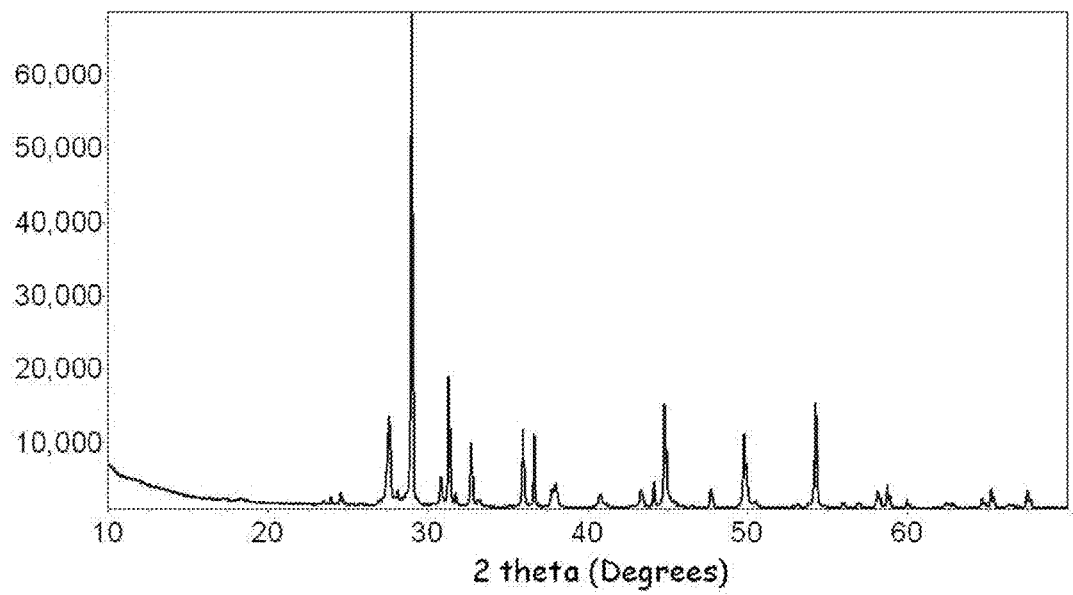
FIG. 11 shows X-ray diffraction pattern of Bi$_{0.9}$Tl$_{0.1}$CuOTe.

X-ray diffraction analysis was conducted for the sample in the same way as the example 3. As shown in FIG. 11, the material obtained in the example 8 was identified as Bi$_{0.9}$Tl$_{0.1}$CuOTe.

Example 9

BiCuOTe$_{0.9}$Sb$_{0.1}$

In order to prepare BiCuOTe$_{0.9}$Sb$_{0.1}$, 1.4951 g of Bi$_2$O$_3$ (Aldrich, 99.9%, 100 mesh), 0.6705 g of Bi (Aldrich, 99.99%, <10 μm), 0.6117 g of Cu (Aldrich, 99.7%, 3 μm), 1.1054 g of Te (Aldrich, 99.99%, ~100 mesh), and 0.1172 g of Sb (Kanto chemical, Cat. No. 01420-02) were well mixed by using agate mortar.

The mixture was then heated in an evacuated silica tube at 510° C. for 15 hours, thereby obtaining BiCuOTe$_{0.9}$Sb$_{0.1}$ powder.

Figure 12:
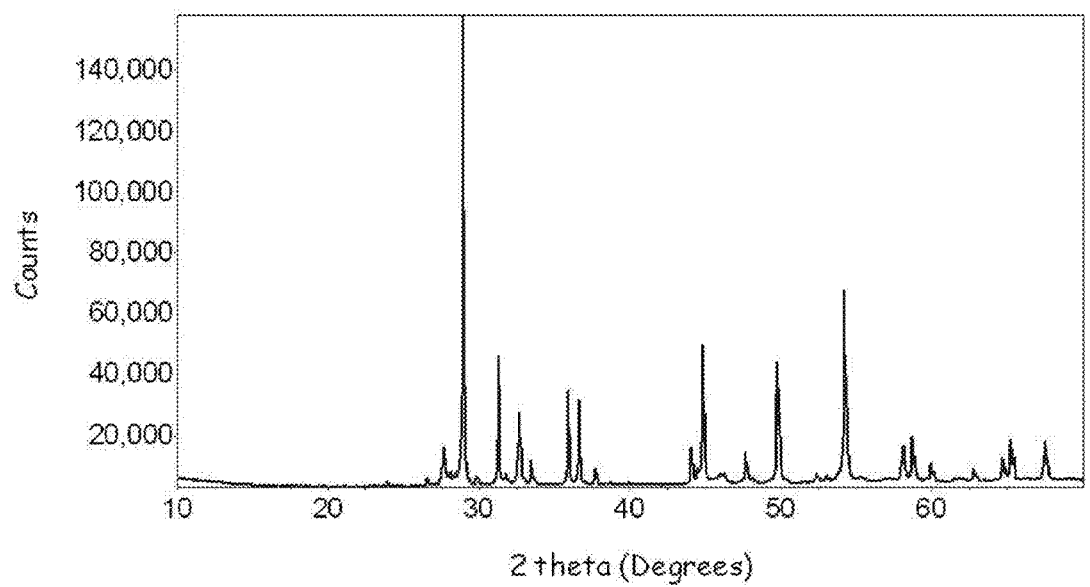
FIG. 12 shows X-ray diffraction pattern of BiCuOTe$_{0.9}$Sb$_{0.1}$.
Figure 13:
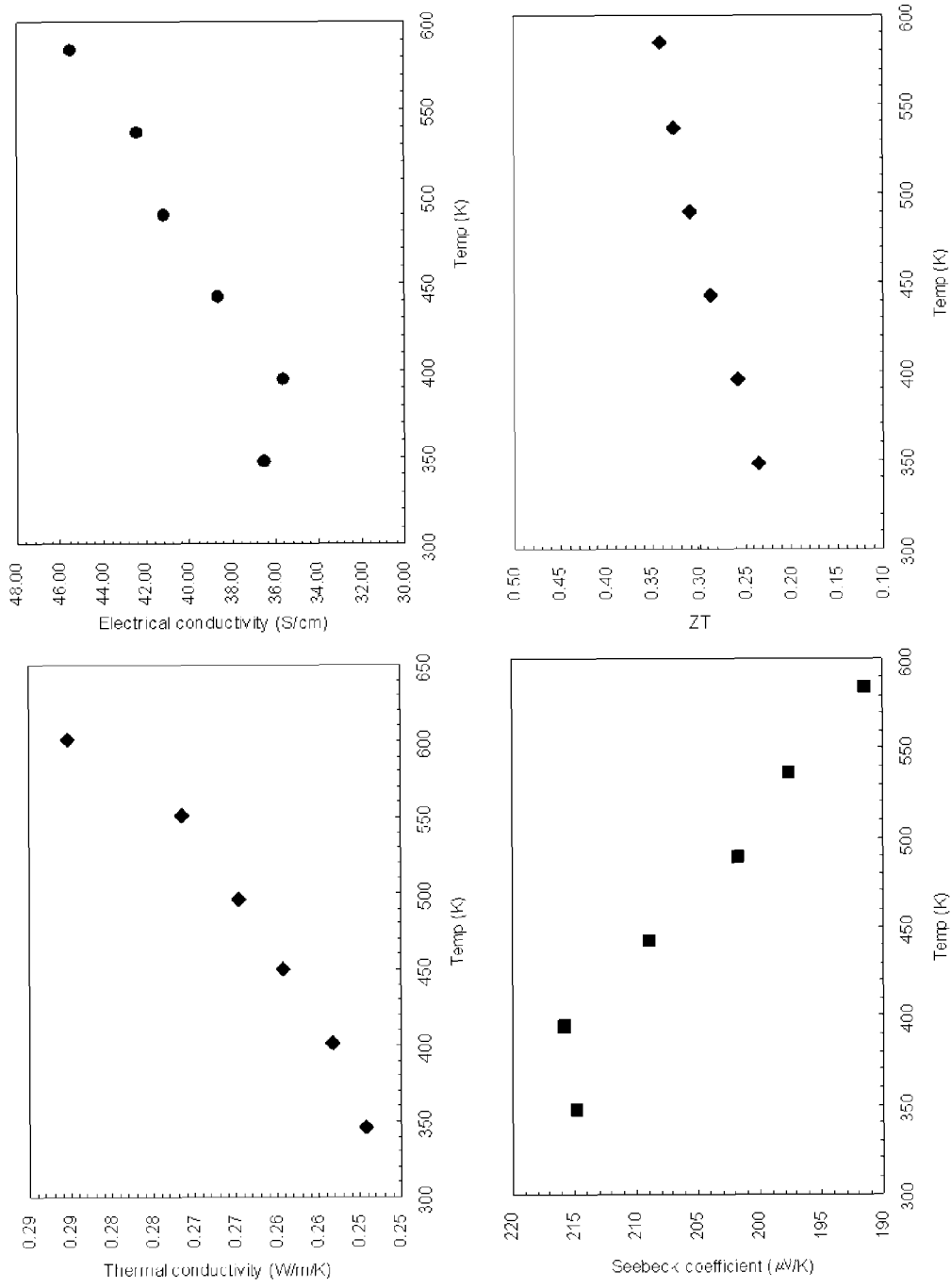
FIG. 13 shows electrical conductivities, Seebeck coefficients, thermal conductivities, and ZT values of BiCuOTe at different temperatures.
Figure 14:
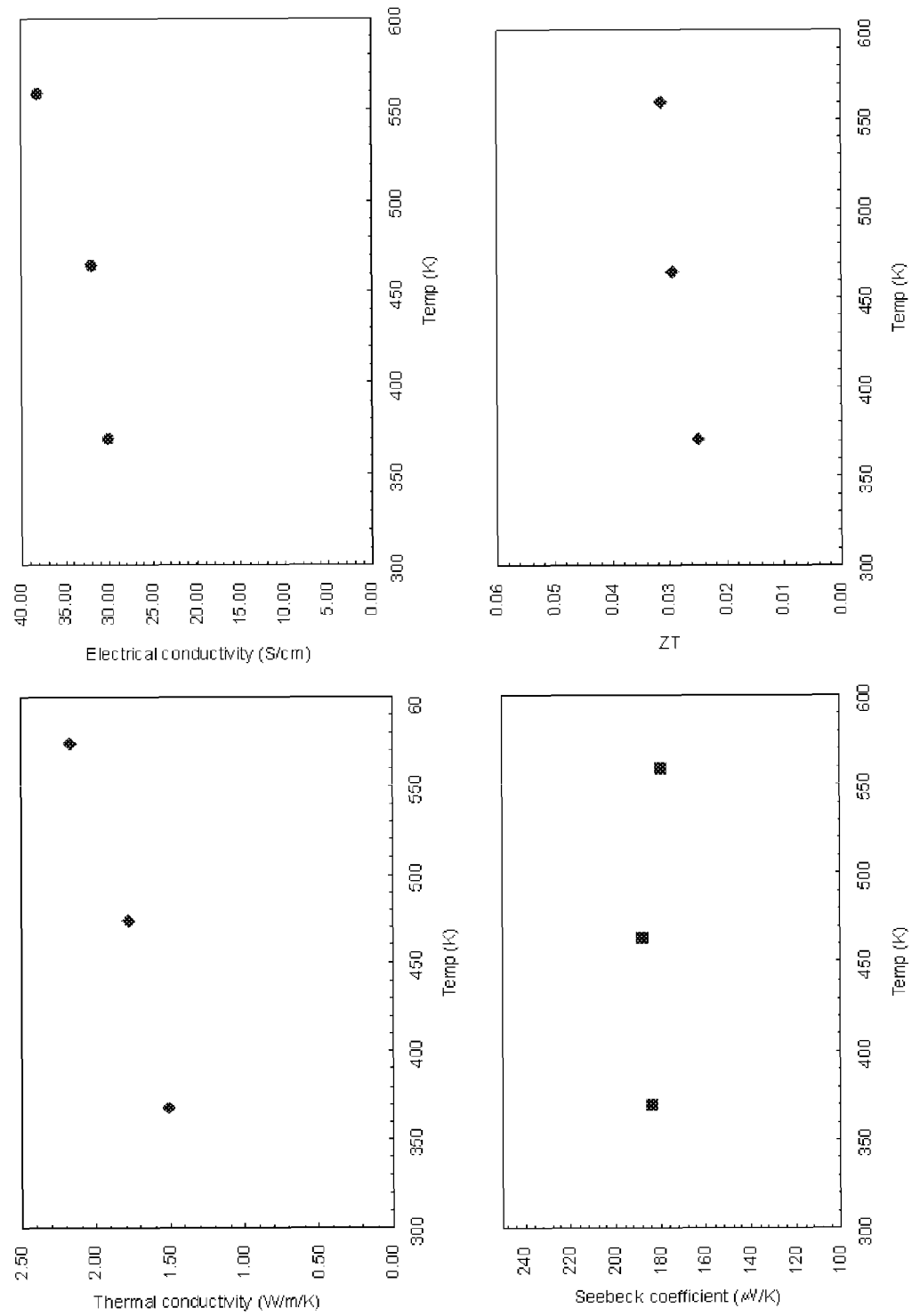
FIG. 14 shows electrical conductivities, Seebeck coefficients, thermal conductivities, and ZT values of Bi$_{0.9}$Sr$_{0.1}$CuOTe at different temperatures.
Figure 15:
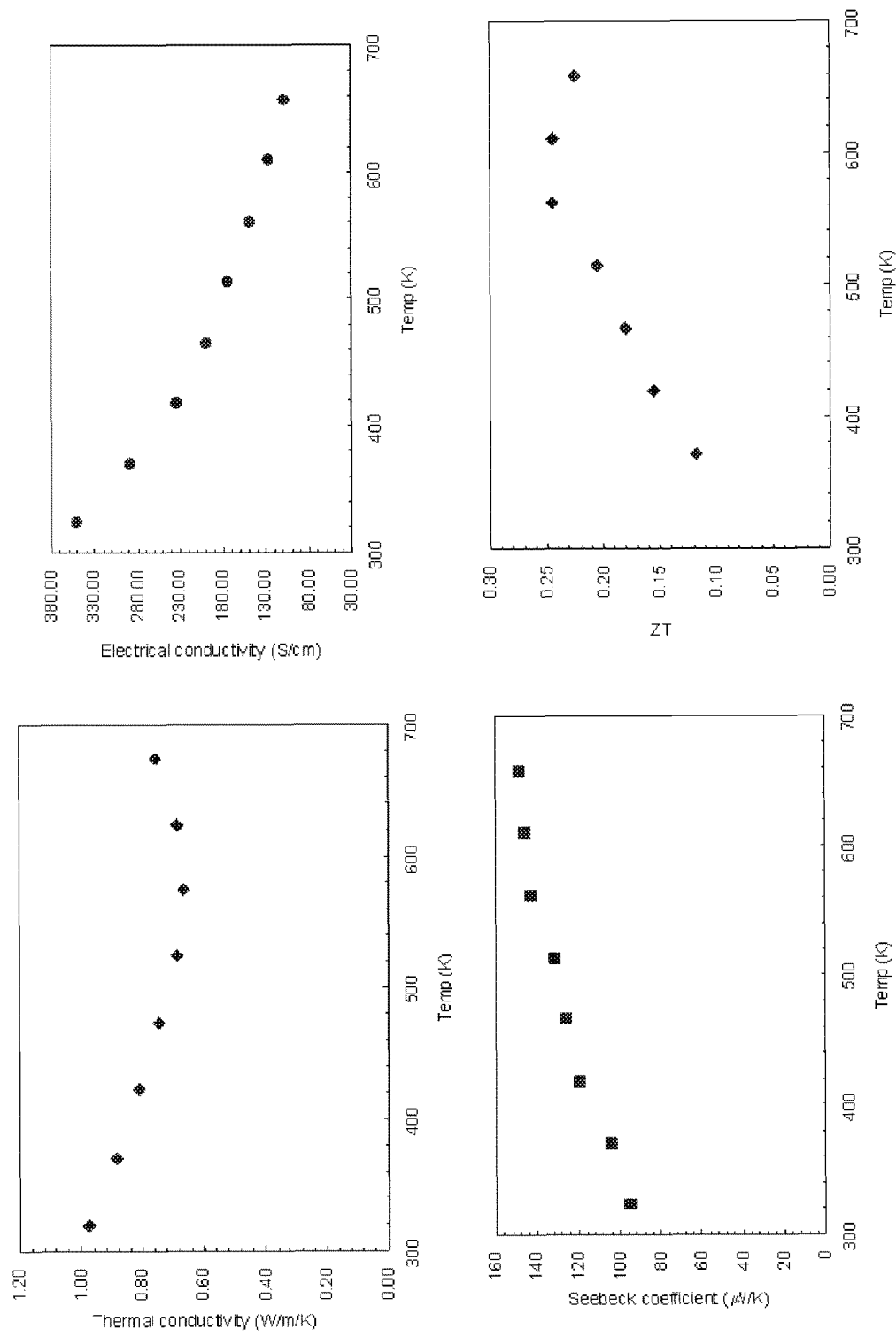
FIG. 15 shows electrical conductivities, Seebeck coefficients, thermal conductivities, and ZT values of Bi$_{0.9}$Cd$_{0.1}$CuOTe at different temperatures.
Figure 16:
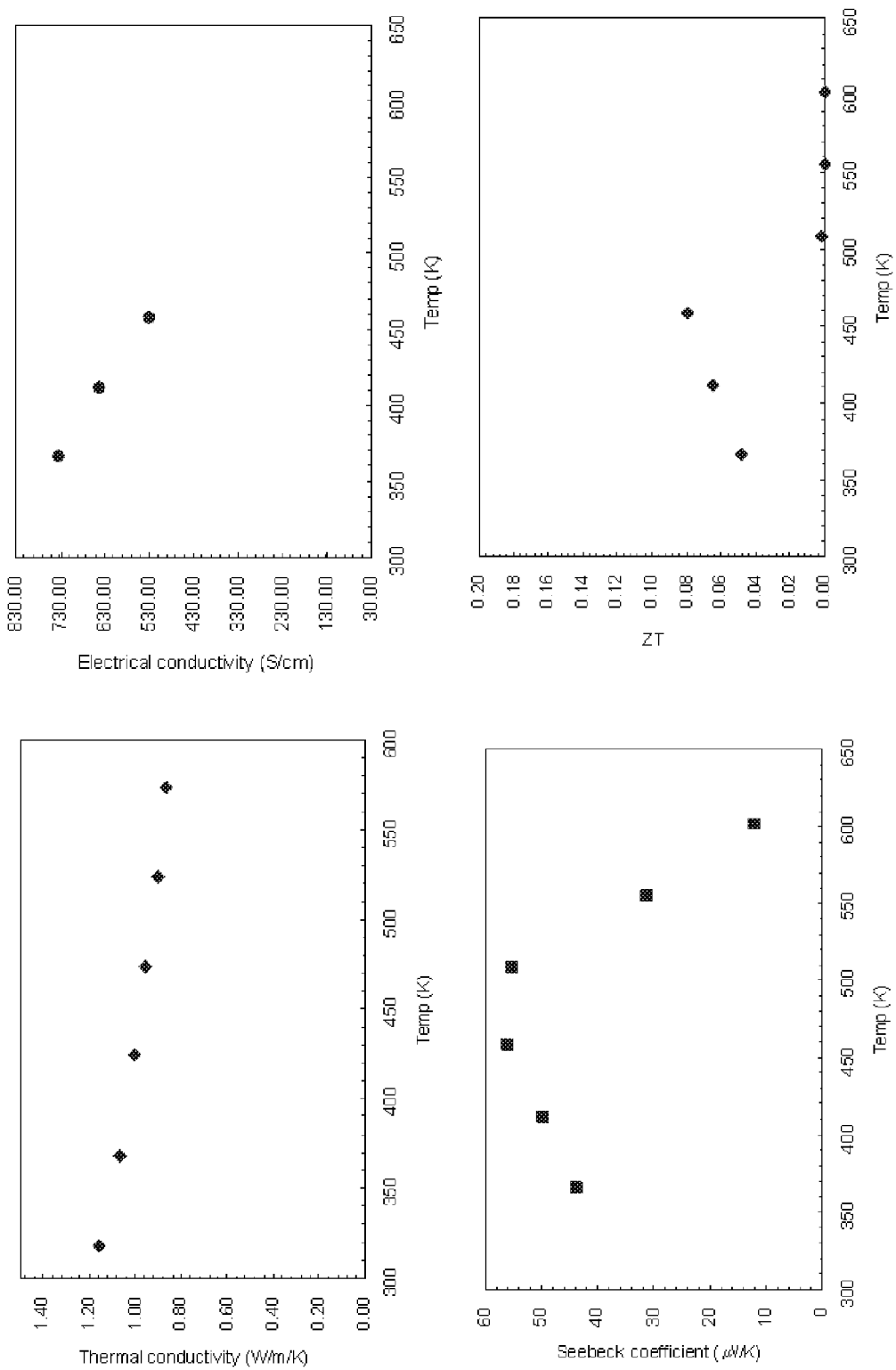
FIG. 16 shows electrical conductivities, Seebeck coefficients, thermal conductivities, and ZT values of Bi$_{0.9}$Pb$_{0.1}$CuOTe at different temperatures.
Figure 17:
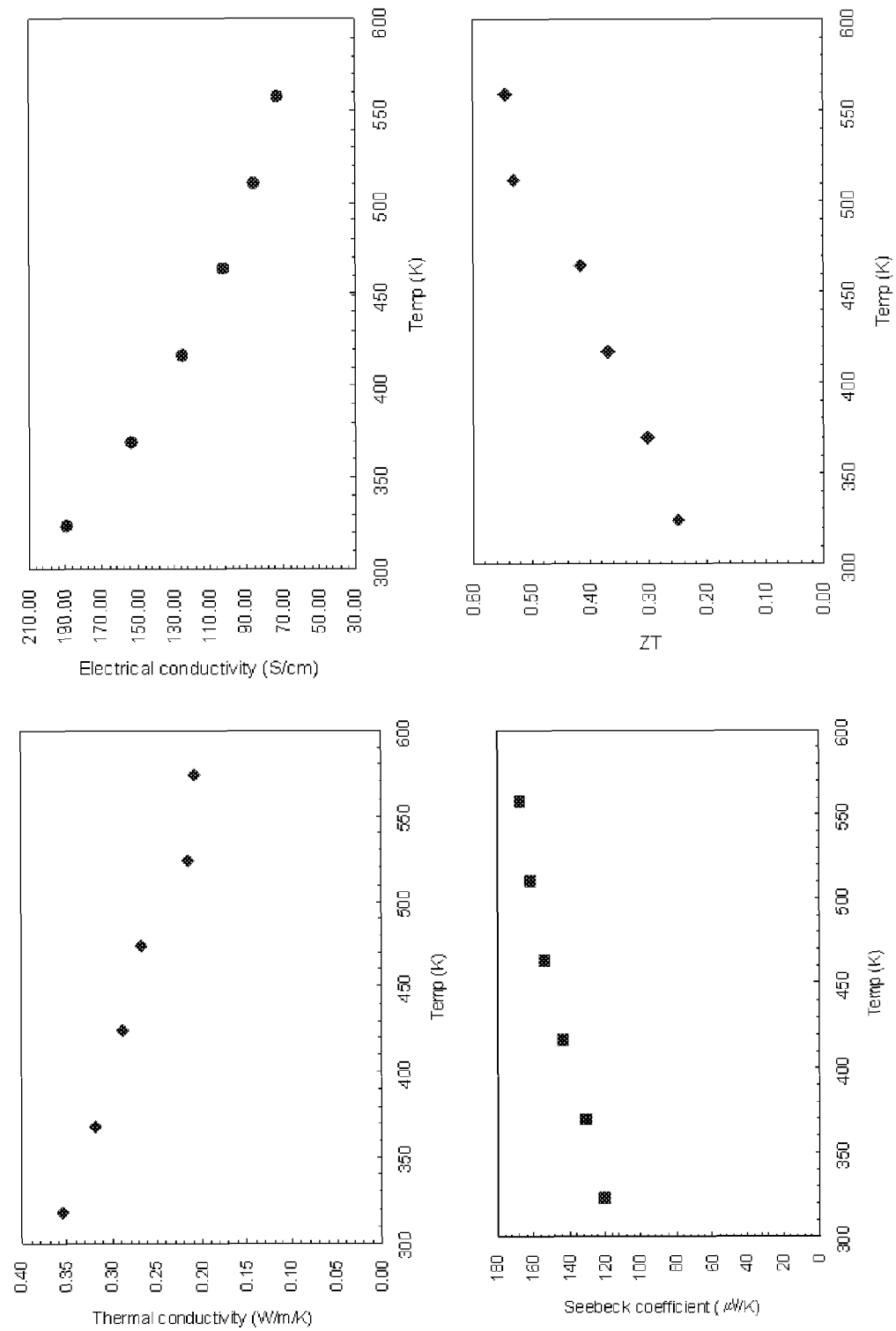
FIG. 17 shows electrical conductivities, Seebeck coefficients, thermal conductivities, and ZT values of Bi$_{0.98}$Pb$_{0.02}$CuOTe at different temperatures.
Figure 18:
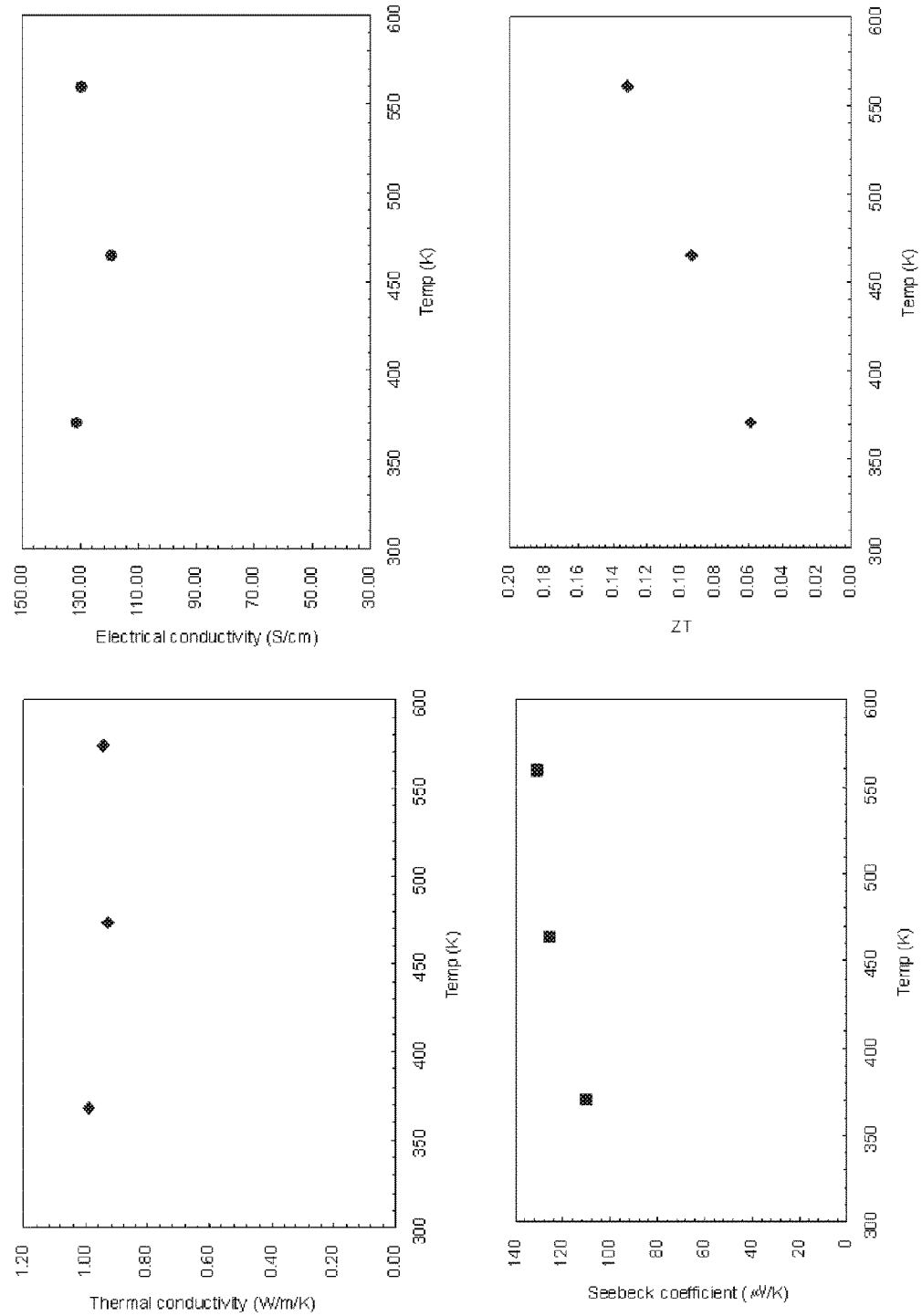
FIG. 18 shows electrical conductivities, Seebeck coefficients, thermal conductivities, and ZT values of Bi$_{0.9}$Tl$_{0.1}$CuOTe at different temperatures.
Figure 19:
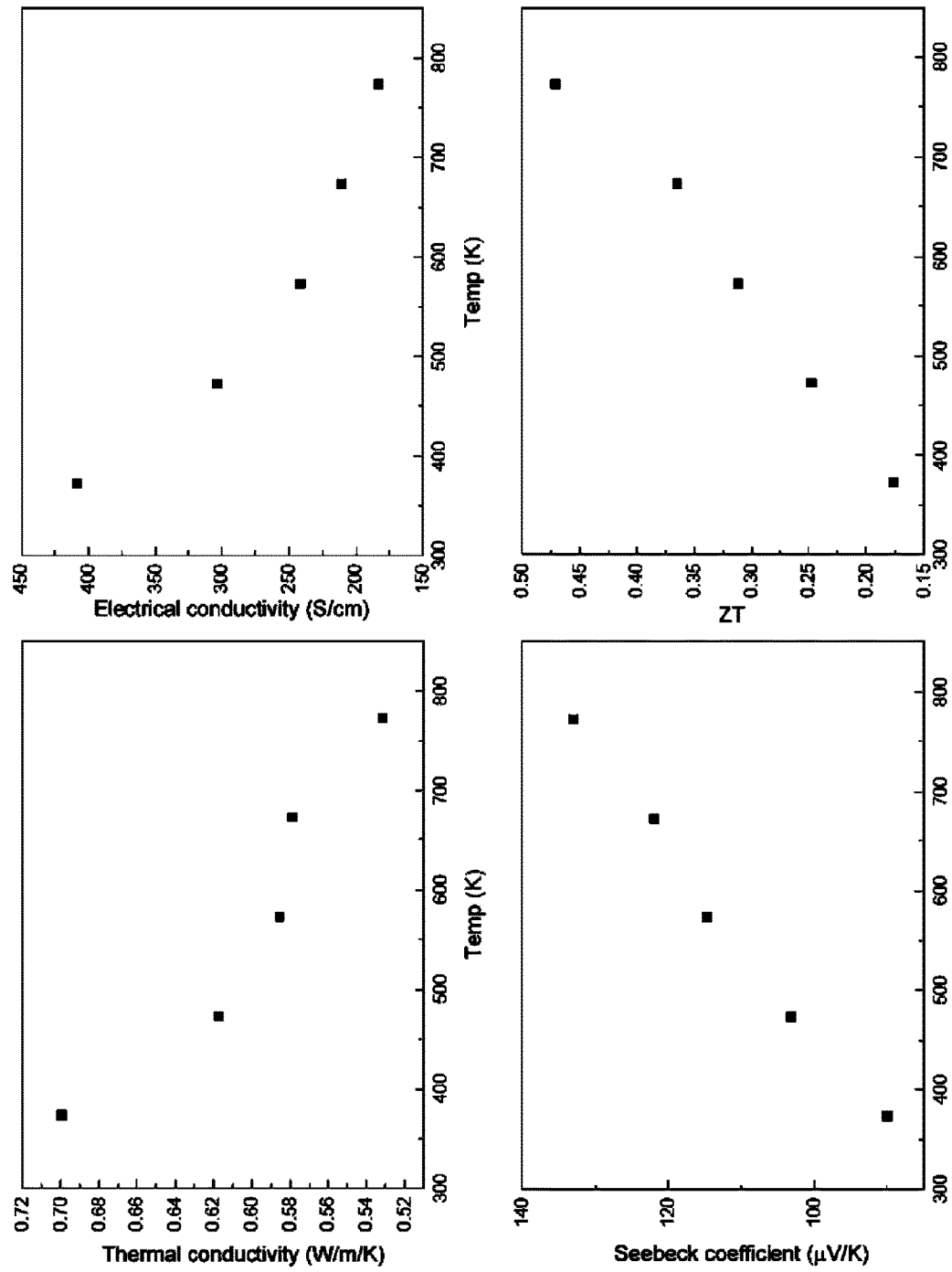
FIG. 19 shows electrical conductivities, Seebeck coefficients, thermal conductivities, and ZT values of Bi$_{0.95}$Pb$_{0.05}$Cu$_{0.96}$O Te$_{0.95}$Se$_{0.05}$ at different temperatures.

X-ray diffraction analysis was conducted for the sample in the same way as the example 3. As shown in FIG. 12, the material obtained in the example 9 was identified as BiCuOTe$_{0.9}$Sb$_{0.1}$.

Example 10

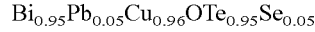
Bi$_{0.95}$Pb$_{0.05}$Cu$_{0.96}$OTe$_{0.95}$Se$_{0.05}$

In order to prepare Bi$_{0.95}$Pb$_{0.05}$Cu$_{0.96}$OTe$_{0.95}$Se$_{0.05}$, 3.7785 g of Bi$_2$O$_3$ (Aldrich, 99.9%, 100 mesh), 1.4404 g of Bi (Aldrich, 99.99%, <10 μm), 1.4840 g of Cu (Aldrich, 99.7%, 3 μm), 0.2520 g of Pb (Alfa aesar, 99.9%, 200 mesh), 2.9489 g of Te (Aldrich, 99.99%, 100 mesh), and 0.0960 g of Se (Alfa aesar, 99.999%, 200 mesh) were well mixed by using agate mortar.

The mixture was then heated in an evacuated silica tube at 500° C. for 12 hours, thereby obtaining Bi$_{0.95}$Pb$_{0.05}$Cu$_{0.96}$OTe$_{0.95}$Se$_{0.05}$ powder.

X-ray diffraction analysis was conducted for the sample in the same way as the example 3, and the material obtained in the example 10 was identified as Bi$_{0.95}$Pb$_{0.05}$Cu$_{0.96}$OTe$_{0.95}$Se$_{0.05}$.

Evaluation of Thermoelectric Conversion Performance

Powder samples obtained in Examples 1, 3 to 6, 8 and 10 were shaped into cylinders with a diameter of 4 mm and a length of 15 mm (for electrical conductivity and Seebeck coefficient measurements), and disks having a diameter of 10 mm and a thickness of 1 mm (for thermal conductivity measurements) by using CIP at the pressure of 200 MPa. Subsequently, the resultant disks and cylinders were heated in an evacuated silica tube at 510° C. for 10 hours (for 12 hours for Example 10).

For the sintered cylinders, electric conductivity and Seebeck coefficient were measured by using a ZEM-2 (Ulvac-Rico, Inc.) The measurement results are shown in FIGS. 13 to 19. For example, at 346 K thermal conductivities of BiCuOTe and Bi$_{0.98}$Pb$_{0.02}$CuOTe were measured as 0.25 W/m/K and 0.35 W/m/K, respectively, which are significantly lower than those of Bi$_2$Te$_3$ (1.9 W/m/K, T. M. Tritt, M. A. Subramanian, MRS Bulletin 31 (2006) 188-194) and Co$_4$Sb$_{12}$:In$_{0.2}$ (2 W/m/K, T. He, J. Chen, D. Rosenfeld, M. A. Subramanian, Chem. Mater. 18 (2006) 759-762) which are representative thermoelectric conversion materials.

Meanwhile, for the sintered disks, thermal conductivity was measured by using TC-9000 (Ulvac-Rico, Inc) (using a LFA457 (Netzsch) for Example 10). The measurement results are shown in FIGS. 13 to 19.

ZT value of each sample was calculated using the measured values. The calculated results are shown in FIGS. 13 to 19.

The invention claimed is:
1. Thermoelectric conversion materials, expressed by the following formula 1:

Bi$_{1-x}$M$_x$Cu$_{1-w}$O$_{a-y}$Q1$_y$Te$_{b-z}$Q2$_z$    Formula 1 where M is at least one element selected from the group consisting of Ba, Sr, Ca, Mg, Cs, K, Na, Cd, Hg, Sn, Pb, Mn, Ga, In, Tl, As and Sb; Q1 and Q2 are at least one element selected from the group consisting of S, Se, As and Sb; x, y, z, w, a, and b are 0≤x<1, 0<w<1, 0.2<a<4, 0≤y<4, 0.2<b<4, 0≤z<4, b>z and x+y+z>0.

2. The thermoelectric conversion materials according to claim 1,
   wherein x, y and z of the formula 1 are respectively 0≤x≤1/2, 0≤y≤a/2 and 0≤z≤b/2.

3. The thermoelectric conversion materials according to claim 1,
wherein a, y, b and z of the formula 1 are respectively a=1, 0≤y<1, b=1 and 0≤z<1.

4. The thermoelectric conversion materials according to claim 3,
wherein x, w, a, y, b and z of the formula 1 are respectively 0≤x<0.15, 0≤w<0.2, a=1, 0≤y<0.2, b=1 and 0≤z<0.5.

5. The thermoelectric conversion materials according to claim 3,
wherein M of the formula 1 is any one selected from the group consisting of Sr, Cd, Pb and Tl.

6. The thermoelectric conversion materials according to claim 3,
wherein Q1 and Q2 of the formula 1 are respectively Se or Sb.

7. The thermoelectric conversion materials according to claim 3,
wherein x, w, a, y, b and z of the formula 1 are respectively 0≤x<0.15, 0<w≤0.2, a=1, 0≤y<0.2, b=1 and 0≤z<0.5; M is any one selected from the group consisting of Sr, Cd, Pb and Tl; Q1 and Q2 are respectively Se or Sb.

8. The thermoelectric conversion materials according to claim 7,
wherein x, a, y, b and z of the formula 1 are respectively 0<x<0.15, a=1, y=0, b=1 and z=0.

9. The thermoelectric conversion materials according to claim 7,
wherein x, y and z of the formula 1 are respectively x=0, a=1, y=0, b=1 and 0<z≤0.5.

10. A method for producing thermoelectric conversion materials,
wherein $Bi_2O_3$, Bi, Cu, Te, and at least one selected from the group consisting of Ba, Sr, Ca, Mg, Cs, K, Na, Cd, Hg, Sn, Pb, Mn, Ga, In, Tl, As and Sb, or their oxides, are mixed and then sintered to produce the thermoelectric conversion materials expressed by the formula 1 in the claim 1.

11. The method for producing thermoelectric conversion materials according to claim 10,
wherein the sintering process is executed at a temperature of 400 to 570° C.

12. A method for producing thermoelectric conversion materials,
wherein $Bi_2O_3$, Bi, Cu, and Te are mixed with at least one selected from the group consisting of S, Se, As and Sb, or their oxides, and then at least one selected from the group consisting of Ba, Sr, Ca, Mg, Cs, K, Na, Cd, Hg, Sn, Pb, Mn, Ga, In, Tl, As and Sb, or their oxides, are selectively further mixed thereto and then sintered to produce the thermoelectric conversion materials expressed by the formula 1 in the claim 1.

13. The method for producing thermoelectric conversion materials according to claim 12,
wherein the sintering process is executed at a temperature of 400 to 570° C.

14. A thermoelectric conversion element, which includes the thermoelectric conversion materials defined in claim 1.

* * * * *